(12) United States Patent
Harada et al.

(10) Patent No.: US 12,159,923 B2
(45) Date of Patent: Dec. 3, 2024

(54) MEMORY DEVICE USING SEMICONDUCTOR ELEMENTS

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 409 days.

(21) Appl. No.: 17/740,656

(22) Filed: May 10, 2022

(65) Prior Publication Data
US 2022/0367679 A1   Nov. 17, 2022

(30) Foreign Application Priority Data

May 13, 2021   (WO) .................. PCT/JP2021/018236

(51) Int. Cl.
*H01L 29/66* (2006.01)
*H01L 21/8238* (2006.01)
(Continued)

(52) U.S. Cl.
CPC ............ *H01L 29/66666* (2013.01); *H01L 21/823885* (2013.01); *H01L 27/1203* (2013.01); *H01L 29/7827* (2013.01); *H01L 29/78642* (2013.01)

(58) Field of Classification Search
None
See application file for complete search history.

(56) References Cited

U.S. PATENT DOCUMENTS

| 6,548,848 B2 * | 4/2003 | Horiguchi | H10B 12/20 |
| | | | 257/317 |
| 8,213,226 B2 * | 7/2012 | Carman | H01L 29/7841 |
| | | | 365/177 |

(Continued)

FOREIGN PATENT DOCUMENTS

| JP | H 02-188966 A | 7/1990 |
| JP | H 03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Bo B Jang
(74) *Attorney, Agent, or Firm* — Crowell & Moring LLP (57) ABSTRACT

Provided on a substrate 1 are an N⁺ layer connecting to a source line SL, a first Si pillar as a P⁺ layer standing in an upright position along the vertical direction, and a second Si pillar as a P layer. An N⁺ layer connecting to a bit line BL is provided on the second Si pillar. A first gate insulating layer is provided so as to surround the first Si pillar, and a second gate insulating layer is provided so as to surround the second Si pillar. A first gate conductor layer connecting to a plate line PL is provided so as to surround the first insulating layer, and a second gate conductor layer connecting to a word line WL is provided so as to surround the second insulating layer. A voltage applied to each of the source line SL, the plate line PL, the word line WL, and the bit line BL is controlled to perform a data write operation for retaining holes, which have been generated through an impact ionization phenomenon or using a gate induced drain leakage (Continued)

current, in a channel region, and a data erase operation for removing the holes from the channel region.

5 Claims, 9 Drawing Sheets

(51) Int. Cl.
    *H01L 27/12*     (2006.01)
    *H01L 29/78*     (2006.01)
    *H01L 29/786*     (2006.01)

(56) References Cited

U.S. PATENT DOCUMENTS

| | | | |
|---|---|---|---|
| 8,710,566 B2 * | 4/2014 | Ellis | H10B 12/488 |
| | | | 257/E27.084 |
| 9,559,216 B2 * | 1/2017 | Banna | H10B 41/27 |
| 2003/0111681 A1 | 6/2003 | Kawanaka | |
| 2006/0049444 A1 | 3/2006 | Shino | |
| 2008/0137394 A1 | 6/2008 | Shimano | |
| 2008/0212366 A1 | 9/2008 | Ohsawa | |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

International Search Report (PCT/ISA/210) (Japanese) from PCT/JP2021/018236 dated Jun. 29, 2021, 3 pgs. See a translation identified as A26.

English translation of International Search of Search Report (PCT/ISA/210) of PCT/JP2021/018236, 2 pgs.

Written Opinion (PCT/ISA/237) (Japanese) of PCT/JP2021/018236 dated Jun. 22, 2021 , 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) a brief description attached.

* cited by examiner

FIG. 1

FIG. 2A "1" WRITTEN STATE

FIG. 2B "0" ERASE OPERATION

Vb: Built-in Voltage ~0.7V
BUILT-IN VOLTAGE TO 0.7 V

FIG. 3A "1" WRITE OPERATION
SOURCE-SIDE IMPACT IONIZATION

FIG. 3B "1" WRITTEN STATE

FIG. 4AC

FIG. 4AA "1" WRITTEN STATE

FIG. 4AB "0" ERASE STATE

Vb: BUILT-IN VOLTAGE TO 0.7 V

BL: BIT LINE
SL: SOURCE LINE
WL: WORD LINE
PL: PLATE LINE
FB: FLOATING BODY

FIG. 4BC $$C_{FB} = C_{PL} + C_{WL} + C_{BL} + C_{SL}$$

$$\Delta V_{FB} = V_{FB2} - V_{FB1}$$
$$= \frac{C_{WL}}{C_{PL} + C_{WL} + C_{BL} + C_{SL}} \times V_{ReadWL} \quad (4)$$

FIG. 7A
Prior Art $C_{FB} = C_{WL} + C_{BL} + C_{SL}$  EXPRESSION (1)

FIG. 7B
Prior Art $\Delta V_{FB} = V_{FB2} - V_{FB1}$ $= \dfrac{C_{WL}}{C_{WL} + C_{BL} + C_{SL}} \times V_{ProgWL}$  EXPRESSION (2)

$\beta = \dfrac{C_{WL}}{C_{WL} + C_{BL} + C_{SL}}$  EXPRESSION (3)

MEMORY DEVICE USING SEMICONDUCTOR ELEMENTS

CROSS-REFERENCE TO RELATED APPLICATIONS

This application claims priority under 35 U.S.C. § 119(a) to PCT/JP2021/018236 filed May 13, 2021, the enter content of which is incorporated herein by reference.

TECHNICAL FIELD

The present invention relates to a memory device using semiconductor elements.

BACKGROUND ART

In recent years, a higher degree of integration and higher performance of memory devices have been demanded in the development of the LSI (Large Scale Integration) technology.

In a common planar MOS transistor, a channel extends in the horizontal direction along the upper surface of a semiconductor substrate. In contrast, a channel of a surrounding-gate transistor (SGT) extends in a direction perpendicular to the upper surface of a semiconductor substrate (for example, see Patent Literature 1 and Non Patent Literature 1). Therefore, when SGTs are used, the density of a semiconductor apparatus can be increased more than when planar MOS transistors are used. Using such SGTs as selection transistors can achieve a high degree of integration of, for example, DRAM (Dynamic Random Access Memory) with a capacitor connected thereto (for example, see Non Patent Literature 2), PCM (Phase Change Memory) with a variable resistance element connected thereto (for example, see Non Patent Literature 3), RRAM (Resistive Random Access Memory; for example, see Non Patent Literature 4), and MRAM (Magneto-resistive Random Access Memory) whose resistance is changed by changing the direction of a magnetic spin using a current (for example, see Non Patent Literature 5). There is also known a capacitorless DRAM memory cell including a single MOS transistor (see Non Patent Literature 6), for example. The present application relates to dynamic flash memory that can be formed with only a MOS transistor and without a variable resistance element or a capacitor.

Figure 6A:
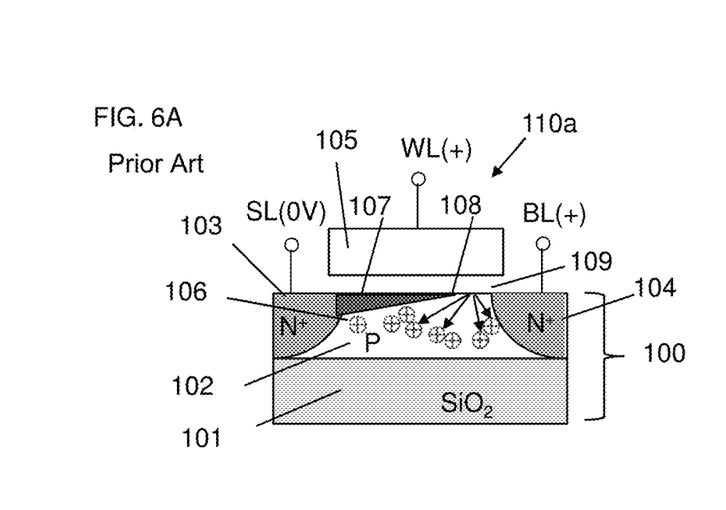
FIGS. 6A, 6B, 6C and 6D are views for illustrating problems with the operation of a conventional capacitorless DRAM memory cell.
Figure 6B:
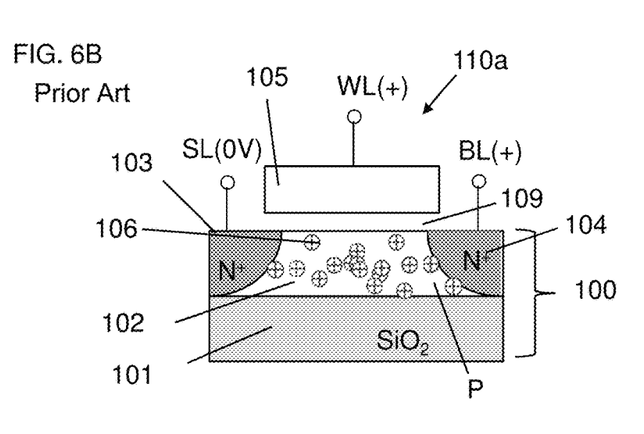
Figure 6C:
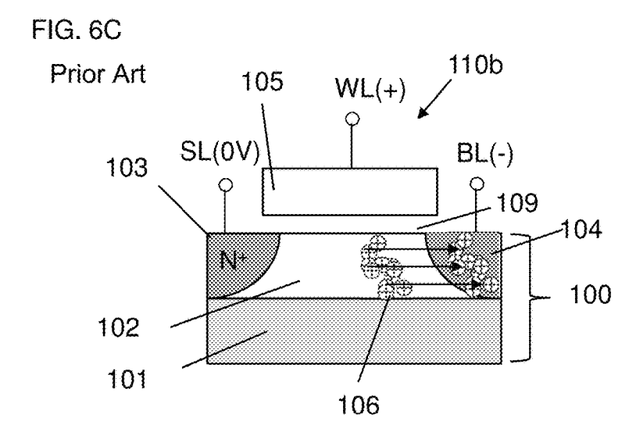
Figure 6D:
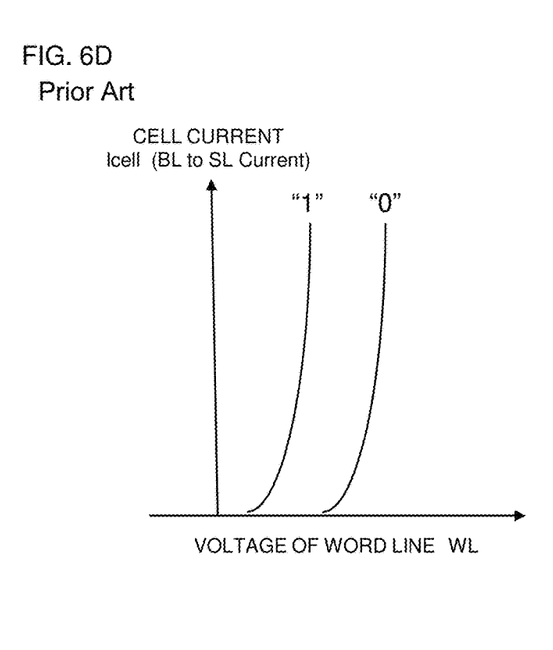
Figure 7A:
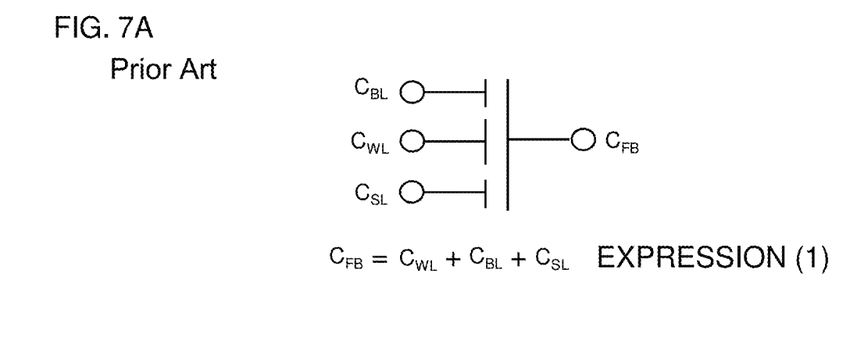
FIGS. 7A and 7B are views for illustrating problems with the operation of a conventional capacitorless DRAM memory cell.
Figure 7B:
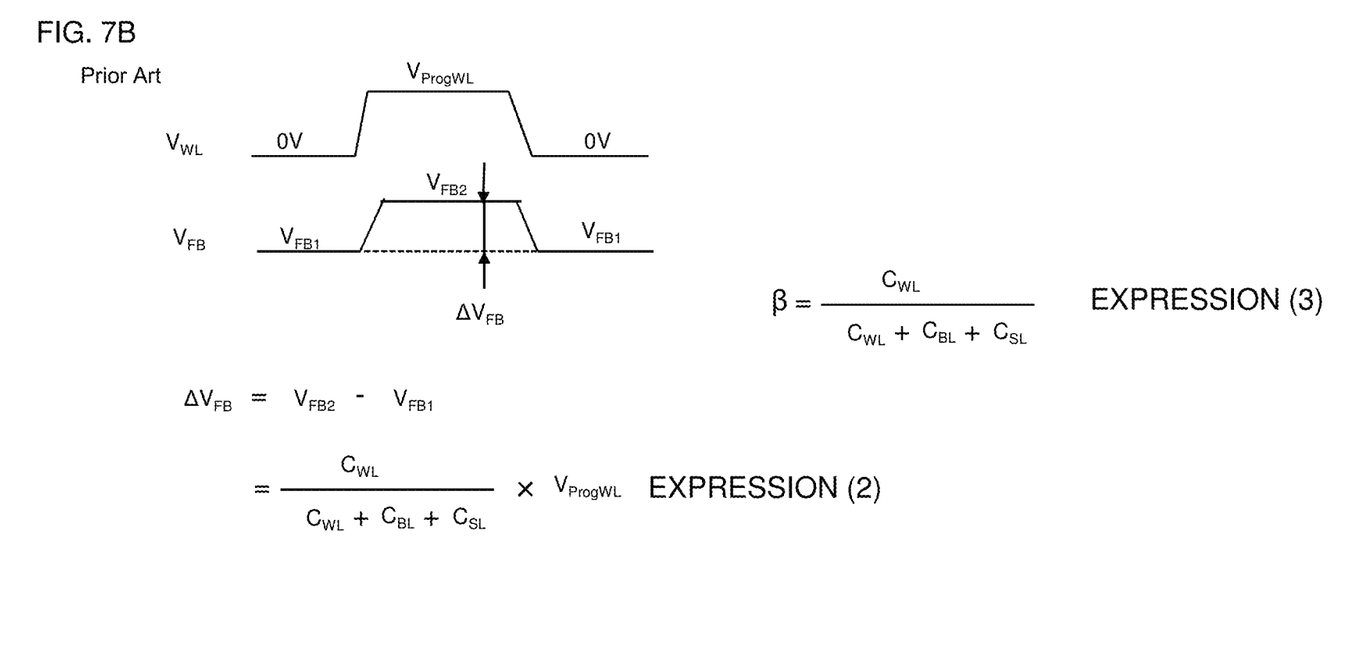
Figure 8A:
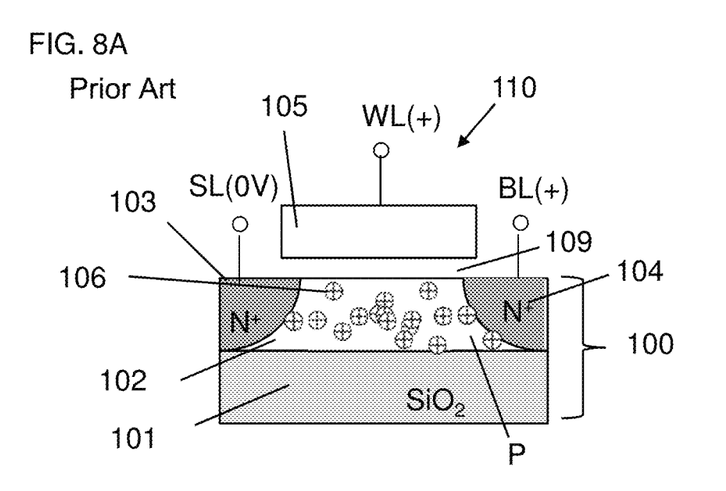
FIGS. 8A, 8B and 8C are views for illustrating a read operation for the conventional capacitorless DRAM memory cell.
Figure 8B:
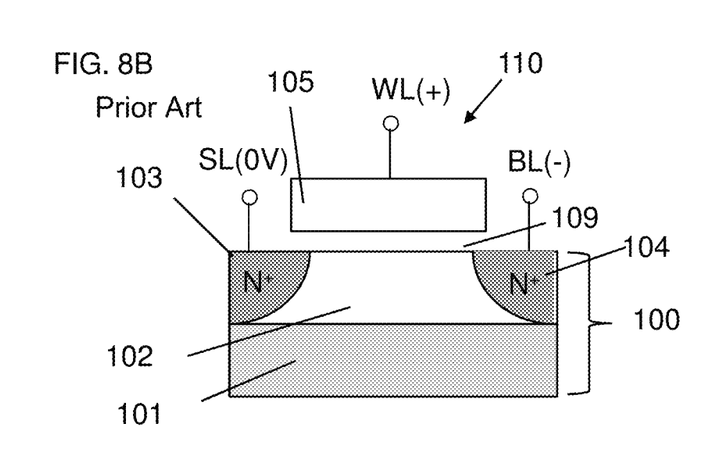
Figure 8C:
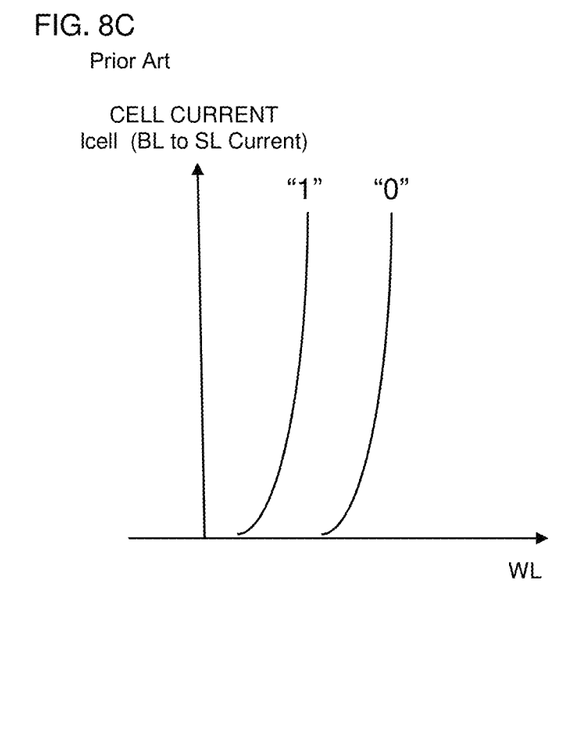

FIGS. 6A-6D illustrate a write operation for the aforementioned capacitorless DRAM memory cell including a single MOS transistor, FIGS. 7A and 7B illustrate problems with the operation thereof, and FIGS. 8A-8C illustrate a read operation (see Non Patent Literatures 7 to 10).

FIGS. 6A-6D illustrate a write operation for the DRAM memory cell. FIG. 6A illustrates a "1" written state. Herein, the memory cell includes a source N$^+$ layer 103 (hereinafter, a semiconductor region containing a high concentration of donor impurities shall be referred to as an "N$^+$ layer") connecting to a source line SL and a drain N$^+$ layer 104 connecting to a bit line BL, each formed in a SOI substrate 100; a gate conductive layer 105 connecting to a word line WL; and a floating body 102 of a MOS transistor 110a. The DRAM memory cell does not include a capacitor, and is formed with a single MOS transistor 110a. It should be noted that the floating body 102 is in contact with a SiO$_2$ layer 101 of the SOI substrate immediately below the floating body 102. When "1" is written to such a memory cell including a single MOS transistor 110a, the MOS transistor 110a is operated in the saturation region. That is, a channel 107 for electrons extending from the source N$^+$ layer 103 has a pinch-off point 108, and thus does not reach the drain N$^+$ layer 104 connecting to the bit line. When the MOS transistor 110a is operated while each of the bit line BL connected to the drain N$^+$ layer 104 and the word line WL connected to the gate conductive layer 105 is set at a high voltage and the gate voltage is set at a level of about ½ that of the drain voltage, the intensity of an electric field becomes maximum at the pinch-off point 108 around the drain N$^+$ layer 104. Consequently, accelerated electrons flowing from the source N$^+$ layer 103 to the drain N$^+$ layer 104 collide with Si lattices, and electron-hole pairs are generated due to the kinetic energy lost during the collision (i.e., an impact ionization phenomenon). Most of the generated electrons (not illustrated) reach the drain N$^+$ layer 104. Meanwhile, only some of the electrons that are very hot reach the gate conductive layer 105 beyond a gate oxide film 109. In addition, holes 106 generated at the same time charge the floating body 102. In such a case, since the floating body 102 is p-type Si, the generated holes contribute to increasing the majority carriers. When the floating body 102 is filled with the generated holes 106 and the voltage of the floating body 102 becomes higher than that of the source N$^+$ layer 103, specifically, Vb or greater, the generated holes are further released to the source N$^+$ layer 103. Herein, Vb is the built-in voltage of a P-N junction between the source N$^+$ layer 103 and the floating body 102 as the P-layer, and is about 0.7 V. FIG. 6B illustrates a view in which the floating body 102 is saturated with and charged with the generated holes 106.

Next, an operation of writing "0" to the memory cell 110 will be described with reference to FIG. 6C. With respect to a common selected word line WL, there randomly exist memory cells 110a to which "1" is written and memory cells 110b to which "0" is written. FIG. 6C illustrates a view in which the state of the memory cell 110 changes from the "1" written state to the "0" written state. When "0" is written, the bit line BL is set at a negative bias voltage so that a P-N junction between the drain N$^+$ layer 104 and the floating body 102 as the P-layer is forward-biased. Consequently, the holes 106, which have been generated in the floating body 102 in advance in the previous cycle, flow to the drain N$^+$ layer 104 connected to the bit line BL. When the write operation is complete, two states of the memory cells are obtained that include the memory cells 110a filled with the generated holes 106 (FIG. 6B) and the memory cells 110b from which the generated holes have been discharged (FIG. 6C). The potential of the floating body 102 in the memory cell 110a filled with the holes 106 is higher than that of the floating body 102 without holes generated therein. Thus, the threshold voltage of the memory cell 110a is lower than the threshold voltage of the memory cell 110b. FIG. 6D illustrates such a state.

Next, problems with the operation of such a memory cell including a single MOS transistor will be described with reference to FIGS. 7A and 7B. As illustrated in FIG. 7A, the capacitance $C_{FB}$ of the floating body 102 is equal to the sum of the capacitance $C_{WL}$ between the gate connecting to the word line and the floating body 102, the junction capacitance $C_{SL}$ of the P-N junction between the source N$^+$ layer 103 connecting to the source line and the floating body 102, and the junction capacitance $C_{BL}$ of the P-N junction between the drain N$^+$ layer 104 connecting to the bit line and the floating body 102, and is represented as follows.

$$C_{FB}=C_{WL}+C_{BL}+C_{SL} \tag{1}$$

Thus, when the voltage $V_{WL}$ of the word line oscillates during writing, the voltage of the floating body 102 as a storage node (i.e., a node) of the memory cell is also influenced. FIG. 7B illustrates such a state. When the voltage $V_{WL}$ of the word line rises from 0 V to $V_{ProgWL}$ during writing, the voltage $V_{FB}$ of the floating body 102 rises from the voltage $V_{FB1}$ in the initial state before the voltage of the word line has changed to $V_{FB2}$ due to capacitive coupling with the word line. The amount of change in the voltage $\Delta V_{FB}$ is represented as follows.

$$\Delta V_{FB} = V_{FB2} - V_{FB1} \quad (2)$$
$$= C_{WL}/(C_{WL} + C_{BL} + C_{SL}) \times V_{ProgWL}$$

Herein, β, which is referred to as a coupling ratio, is represented as follows.

$$\beta = C_{WL}/(C_{WL} + C_{BL} + C_{SL}) \quad (3)$$

In such a memory cell, the contribution rate of $C_{WL}$ is high, and, for example, $C_{WL}:C_{BL}:C_{SL}=8:1:1$. In such a case, β=0.8. When the voltage of the word line has changed from 5 V during writing to 0 V at the completion of the writing, for example, the floating body 102 receives oscillation noise with 5 V×β=4 V due to the capacitive coupling between the word line and the floating body 102. Therefore, there has been a problem in that a sufficient margin cannot be provided for the potential difference between the potentials of the floating body when "1" is written thereto and "0" is written thereto.

FIGS. 8A-8C illustrate a read operation. Specifically, FIG. 8A illustrates a "1" written state and FIG. 8B illustrates a "0" written state. However, in practice, even when Vb has been written to the floating body 102 during writing of "1," the floating body 102 is negative-biased once the voltage of the word line returns to 0 V at the completion of the writing. When "0" is written, the floating body 102 is negative-biased further deeply. Thus, as illustrated in FIG. 8C, it would be impossible to provide a sufficient margin for the potential difference between when "1" is written and when "0" is written. Such a small operation margin has been a big problem with the present DRAM memory cell. In addition, it is also demanded to increase the density of such a DRAM memory cell.

CITATION LIST

Patent Literature

[Patent Literature 1]
Japanese Patent Laid-Open No. 2-188966
[Patent Literature 2]
Japanese Patent Laid-Open No. 3-171768
[Patent Literature 3] Japanese Patent No. 3957774

Non Patent Literature

[Non Patent Literature 1]
Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[Non Patent Literature 2]
H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[Non Patent Literature 3]
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[Non Patent Literature 4]
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V," IEDM (2007)
[Non Patent Literature 5]
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[Non Patent Literature 6]
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[Non Patent Literature 7]
J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012)
[Non Patent Literature 8]
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002).
[Non Patent Literature 9]
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[Non Patent Literature 10]
E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).
[Non Patent Literature 11]
J. Y. Song, W. Y. Choi, J. H. Park, J. D. Lee, and B-G. Park: "Design Optimization of Gate-All-Around (GAA) MOS-FETs," IEEE Trans. Electron Devices, vol. 5, no. 3, pp. 186-191, May 2006.
[Non Patent Literature 12]
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[Non Patent Literature 13]
H. Jiang, N. Xu, B. Chen, L. Zengl, Y. He, G. Du, X. Liu and X. Zhang: "Experimental investigation of self-heating effect (SHE) in multiple-fin SOI FinFETs," Semicond. Sci. Technol. 29 (2014) 115021 (7 pp).
[Non Patent Literature 14]
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.

SUMMARY OF INVENTION

Technical Problem

In a memory device using SGTs, each capacitorless single-transistor DRAM (i.e., a gain cell) involves strong capacitive coupling between a word line and a body of the SGT in a floating state, and thus has a problem in that when the potential of the word line is oscillated during data reading or data writing, the oscillation is directly transmitted as noise to the body of the SGT. Consequently, problems, such as erroneous reading and erroneous rewriting of memory data, occur, making it difficult to put the capacitorless single-transistor DRAM (i.e., the gain cell) into practical use. In addition to solving such problems, it is also necessary to increase the density of the DRAM memory cell.

Solution to Problem

To solve the aforementioned problems, a memory device according to the present invention includes
  a first semiconductor base material provided on a substrate in a manner standing in an upright position along a vertical direction or extending in a horizontal direction with respect to the substrate;
  a second semiconductor base material continuous with the first semiconductor base material, the second semiconductor base material having the same conductivity as the first semiconductor base material and having a lower concentration of impurities than a concentration of impurities in the first semiconductor base material;
  a first gate insulating layer partially or entirely surrounding a side face of the first semiconductor base material on one end side;
  a second gate insulating layer continuous with the first gate insulating layer, and partially or entirely surrounding a side face of the second semiconductor base material on another end side;
  a first gate conductor layer covering the first gate insulating layer;
  a second gate conductor layer covering the second gate insulating layer;
  a first impurity layer provided on an outer side of one end of the first gate conductor layer along a direction of extension of the first semiconductor base material, the first impurity layer having a polarity opposite to a polarity of the first semiconductor base material; and
  a second impurity layer provided on an outer side of one end of the second gate conductor layer, the second impurity layer having a polarity opposite to a polarity of the second semiconductor base material,
in which:
  each of a memory write operation, a memory read operation, and a memory erase operation is performed by controlling a voltage applied to the first impurity layer, the second impurity layer, the first gate conductor layer, and the second gate conductor layer (first invention).

In the aforementioned first invention, a concentration of impurities in the first semiconductor base material is lower than a concentration of impurities in the first impurity layer (second invention).

In the aforementioned first invention, an outer circumferential line of the first semiconductor base material as seen from a central axis direction is located on an outer side of an outer circumferential line of the second semiconductor base material (third invention).

In the aforementioned first invention, a first gate capacitance between the first gate conductor layer and the first semiconductor base material is larger than a second gate capacitance between the second gate conductor layer and the second semiconductor base material (fourth invention).

The memory write operation is performed by performing an operation of generating electrons and holes in one or both of the first semiconductor base material and the second semiconductor base material through an impact ionization phenomenon based on a current flowed between the first impurity layer and the second impurity layer or using a gate induced drain leakage current, an operation of removing, from among the generated electrons and holes, the electrons or the holes that are minority carriers in the first semiconductor base material and the second semiconductor base material, and an operation of causing the electrons or the holes that are majority carriers in the first semiconductor base material and the second semiconductor base material to partially or entirely remain in at least the first semiconductor base material, and
  the memory erase operation is performed by controlling a voltage applied to each of the first impurity layer, the second impurity layer, the first gate conductor layer, and the second gate conductor layer to remove from the first semiconductor base material and the second semiconductor base material the electrons or the holes that are the majority carriers remaining in the first semiconductor base material and the second semiconductor base material (fifth invention).

BRIEF DESCRIPTION OF DRAWINGS

FIGS. 4AA, 4AB and 4AC are views for illustrating the mechanism of a read operation for the memory device including the SGTs according to the first embodiment.

FIGS. 4BA, 4BB, 4BC and 4BD are views for illustrating the mechanism of a read operation for the memory device including the SGTs according to the first embodiment.

MODE FOR CARRYING OUT THE INVENTION

Hereinafter, the structure, a driving scheme, and a production method for a memory device using semiconductor elements (hereinafter referred to as dynamic flash memory) according to the present invention will be described with reference to the drawings.

First Embodiment

The structure, the operation mechanism, and a production method for a dynamic flash memory cell according to a first embodiment of the present invention will be described with reference to FIGS. 1 to 5. The structure of the dynamic flash memory cell will be described with reference to FIG. 1. Then, a data erasing mechanism will be described with reference to FIGS. 2A-2C, a data writing mechanism will be described with reference to FIGS. 3A-3C, and a data reading mechanism will be described with reference to FIGS. 4AA-4AC and 4BA-4BD. Then, a method for producing the dynamic flash memory will be described with reference to FIG. 5.

Figure 1:
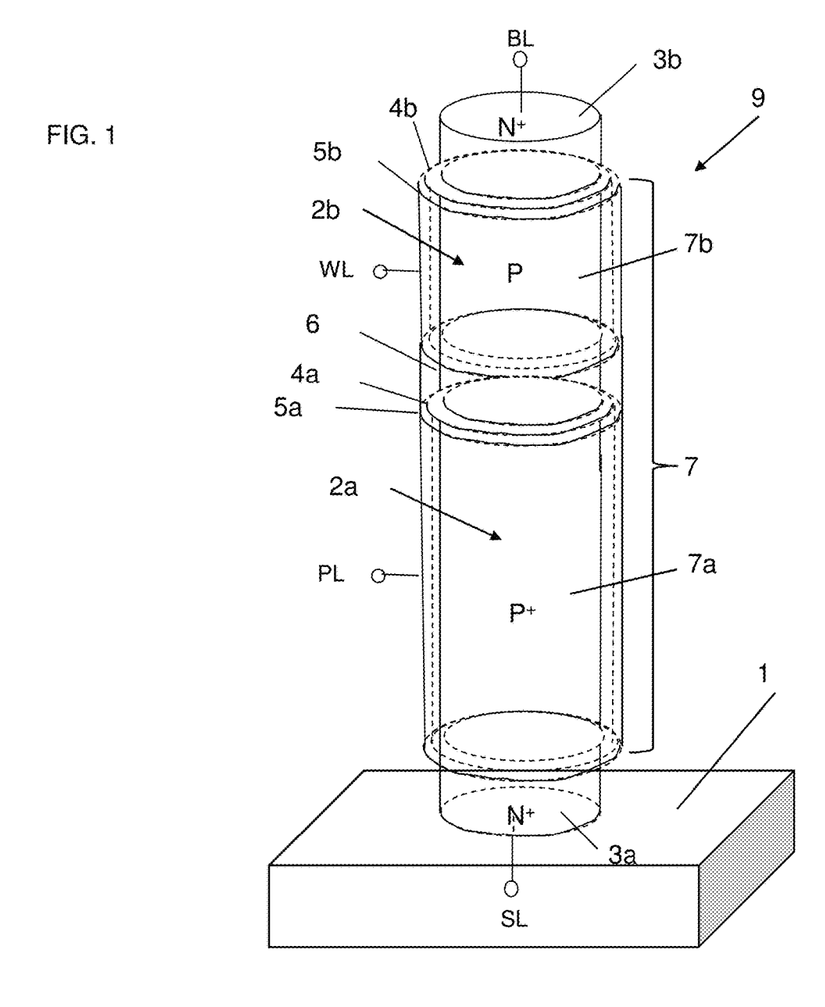
FIG. 1 is a view illustrating the structure of a memory device including SGTs according to a first embodiment.

FIG. 1 illustrates the structure of the dynamic flash memory cell according to the first embodiment of the present invention. An $N^+$ layer $3a$ (which is an example of a "first impurity layer" in the claims) is provided on a substrate 1 (which is an example of a "substrate" in the claims). A first silicon semiconductor pillar $2a$ with p-type conductivity containing acceptor impurities (which is an example of a "first semiconductor base material" in the claims) (hereinafter, the silicon semiconductor pillar shall be referred to as a "Si pillar") is provided on the $N^+$ layer $3a$, and a p-type second Si pillar $2b$ is provided thereon. An $N^+$ layer $3b$ (which is an example of a "second impurity layer" in the claims) is provided on the second Si pillar $2b$. The concentration of acceptor impurities in the Si pillar $2a$ is higher than the concentration of acceptor impurities in the Si pillar $2b$. A portion of the Si pillars $2a$ and $2b$ between the $N^+$ layers $3a$ and $3b$ is a channel region 7. A first gate insulating layer $4a$ (which is an example of a "first gate insulating layer" in the claims) is provided so as to surround the first Si pillar $2a$, and a second gate insulating layer $4b$ (which is an example of a "second gate insulating layer" in the claims) is provided so as to surround the second Si pillar $2b$. A first gate conductor layer $5a$ (which is an example of a "first gate conductor layer" in the claims) is provided so as to surround the first gate insulating layer $4a$, and a second gate conductor layer $5b$ (which is an example of a "second gate conductor layer" in the claims) is provided so as to surround the second gate insulating layer $4b$. The first gate conductor layer $5a$ and the second gate conductor layer $5b$ are separated by an insulating layer 6. The channel region 7 includes a first channel region $7a$ as a $P^+$ layer surrounded by the first gate insulating layer $4a$, and a second channel region $7b$ as a P layer surrounded by the second gate insulating layer $4b$. Accordingly, a dynamic flash memory cell is formed that includes the $N^+$ layers $3a$ and $3b$, the $P^+$-type first Si pillar $2a$, the P-type second Si pillar $2b$, the first gate insulating layer $4a$, the second gate insulating layer $4b$, the first gate conductor layer $5a$, and the second gate conductor layer $5b$. The $N^+$ layer $3a$ connects to a source line SL, the $N^+$ layer $3b$ connects to a bit line BL, the first gate conductor layer $5a$ connects to a plate line PL, and the second gate conductor layer $5b$ connects to a word line WL. The dynamic flash memory cell desirably has such a structure that the gate capacitance of the first gate conductor layer $5a$ connecting to the plate line PL is larger than the gate capacitance of the second gate conductor layer $5b$ connecting to the word line WL. In the memory device, the aforementioned plurality of dynamic flash memory cells are two-dimensionally arranged on the substrate 1.

It should be noted that in FIG. 1, the gate length of the first gate conductor layer $5a$ is set longer than the gate length of the second gate conductor layer $5b$ such that the gate capacitance of the first gate conductor layer $5a$ connected to the plate line PL becomes larger than the gate capacitance of the second gate conductor layer $5b$ connected to the word line WL. However, it is also possible to, without setting the gate length of the first gate conductor layer $5a$ to be longer than the gate length of the second gate conductor layer $5b$, make the thickness of the gate insulating film for the first gate insulating layer $4a$ to be thinner than the thickness of the gate insulating film for the second gate insulating layer $4b$. Alternatively, it is also possible to set the dielectric constant of the first gate insulating layer $4a$ to be higher than the dielectric constant of the second gate insulating layer $4b$. As a further alternative, it is also possible to combine any of the lengths of the gate conductor layers $5a$ and $5b$ and the thicknesses and dielectric constants of the gate insulating layers $4a$ and $4b$ so that the gate capacitance of the first gate conductor layer $5a$ becomes larger than the gate capacitance of the second gate conductor layer $5b$.

The boundary between the first channel region $7a$ as the $P^+$ layer of the first Si pillar $2a$ and the second channel region $7b$ as the P layer of the second Si pillar $2b$ in the vertical direction may be located at the position of the insulating layer 6, or may be located at the upper portion of the first Si pillar $2a$ or the lower portion of the second Si pillar $2b$.

The first gate conductor layer $5a$ may be split into two or more conductor layers, and the resulting two or more conductor layers may be operated synchronously or asynchronously as conductor electrodes for the plate line. Similarly, the second gate conductor layer $5b$ may be split into two or more conductor layers, and the resulting two or more conductor layers may be operated synchronously or asynchronously as conductor electrodes for the word line. Even with such a structure, the dynamic flash memory operation can be performed.

Figure 2A:
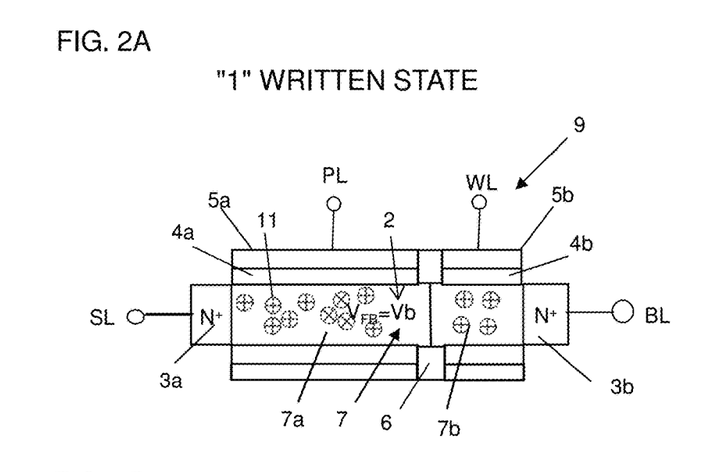
FIGS. 2A, 2B and 2C are views for illustrating the mechanism of an erase operation for the memory device including the SGTs according to the first embodiment.
Figure 2B:
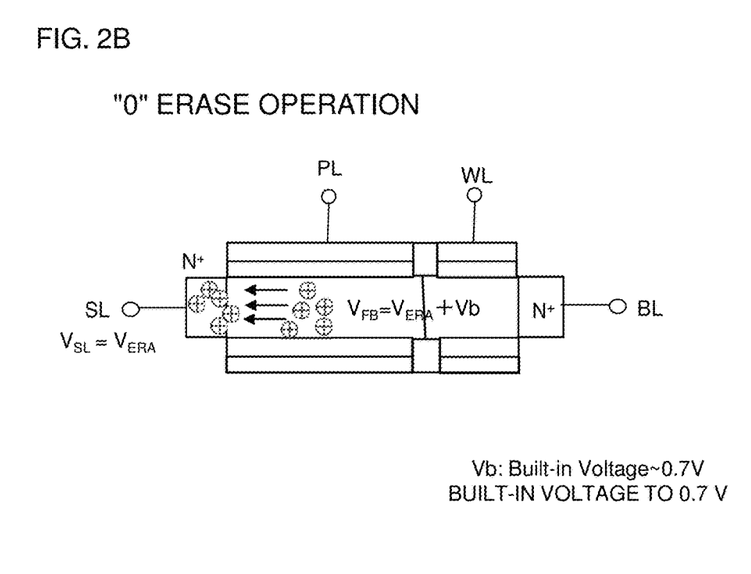
Figure 2C:
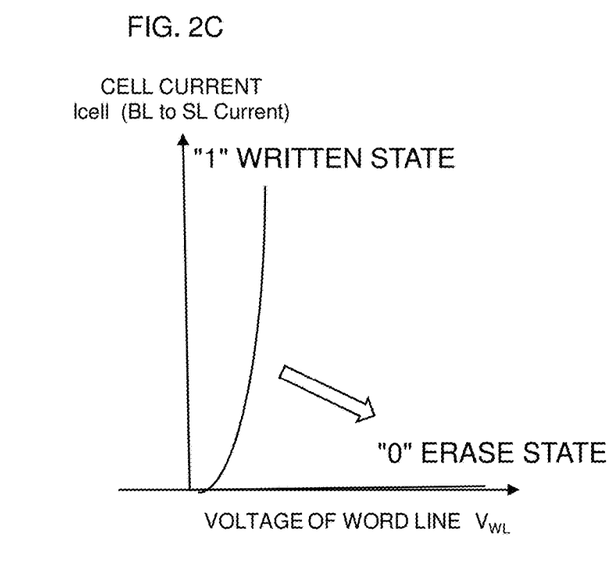

FIGS. 2A-2C describes a mechanism of an erase operation. The channel region 7 between the $N^+$ layers $3a$ and $3b$ is electrically isolated from the substrate, and functions as a floating body. FIG. 2A illustrates a state in which holes 11 generated through impact ionization in a previous cycle are stored in the channel region 7 before the erase operation is started. Since the concentration of acceptor impurities in the first channel region $7a$ is higher than that in the second channel region $7b$, the density of holes stored in the first channel region $7a$ is higher than that in the second channel region $7b$. As illustrated in FIG. 2B, during the erase operation, the voltage of the source line SL is set to a negative voltage $V_{ERA}$. Herein $V_{ERA}$ is −3 V, for example. Consequently, the P-N junction between the $N^+$ layer $3a$ serving as a source connecting to the source line SL and the channel region 7 is forward-biased regardless of the value of the initial potential of the channel region 7. Thus, the holes 11 generated through impact ionization in the previous cycle and stored in the channel region 7 are sucked into the $N^+$ layer $3a$ serving as the source portion, and then, the potential $V_{FB}$ of the channel region 7 becomes $V_{FB}=V_{ERA}+Vb$. Herein, Vb is the built-in voltage of the P-N junction, and is about 0.7 V. Thus, when $V_{ERA}=-3$ V, the potential of the channel region 7 becomes −2.3 V. Such a value corresponds to the potential level of the channel region 7 in the erase state. Therefore, when the potential of the channel region 7 functioning as the floating body becomes a negative voltage, the threshold voltage of the N-channel MOS transistor in the dynamic flash memory cell 9 becomes high due to the substrate bias effect. Accordingly, as illustrated in FIG. 2C, the threshold voltage of the second gate conductor layer 5b connecting to the word line WL becomes high. Such an erase state of the channel region 7 corresponds to logical memory data "0." It should be noted that in reading data, setting the voltage applied to the first gate conductor layer 5a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high for reading the logical memory data "0" as illustrated in FIG. 2C. The aforementioned conditions of the voltages applied to the bit line BL, the source line SL, the word line WL, and the plate line PL are only examples for performing an erase operation. Thus, other operating conditions may also be employed as long as an erase operation can be performed. For example, an erase operation may be performed by providing a voltage difference between the bit line BL and the source line SL.

Figure 3A:
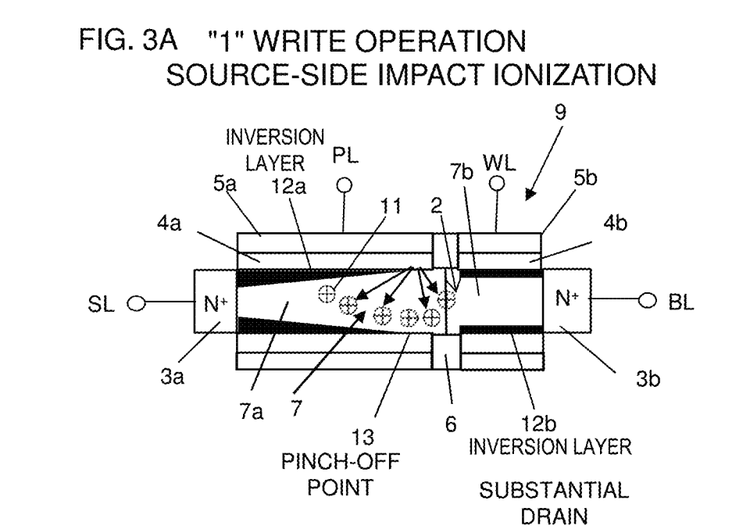
FIGS. 3A, 3B and 3C are views for illustrating the mechanism of a write operation for the memory device including the SGTs according to the first embodiment.

FIGS. 3A-3C illustrate a write operation for the dynamic flash memory cell according to the first embodiment of the present invention. As illustrated in FIG. 3A, 0 V, for example, is input to the N$^+$ layer 3a connecting to the source line SL, 3 V, for example, is input to the N$^+$ layer 3b connecting to the bit line BL, 2 V, for example, is input to the first gate conductor layer 5a connecting to the plate line PL, and 5 V, for example, is input to the second gate conductor layer 5b connecting to the word line WL. Consequently, as illustrated in FIG. 3A, an annular inversion layer 12a is formed in the first channel region 7a on the inner side of the first gate conductor layer 5a connecting to the plate line PL, and a first N-channel MOS transistor region including the channel region 7a surrounded by the first gate conductor layer 5a (see FIG. 1) is operated in the saturation region. Thus, the inversion layer 12a on the inner side of the first gate conductor layer 5a connecting to the plate line PL has a pinch-off point 13. Meanwhile, a second N-channel MOS transistor region including the channel region 7b surrounded by the second gate conductor layer 5b connecting to the word line WL (see FIG. 1) is operated in the linear region. Thus, the second channel region 7b on the inner side of the second gate conductor layer 5b connecting to the word line WL has no pinch-off point, and an inversion layer 12b is formed on the entire surface. The inversion layer 12b formed on the entire surface on the inner side of the second gate conductor layer 5b connecting to the word line WL functions as a substantial drain of the first N-channel MOS transistor region including the first gate conductor layer 5a. Thus, an electric field in a first boundary region of the channel region 7 between the first N-channel MOS transistor region including the first gate conductor layer 5a and the second N-channel MOS transistor region including the second gate conductor layer 5b, which are connected in series, becomes maximum, and an impact ionization phenomenon occurs in the region. Such a region is a region on the source side as seen from the second N-channel MOS transistor region including the second gate conductor layer 5b connecting to the word line WL. Thus, such a phenomenon is called a source-side impact ionization phenomenon. Due to the source-side impact ionization phenomenon, electrons flow from the N$^+$ layer 3a connecting to the source line SL to the N$^+$ layer 3b connecting to the bit line BL. The accelerated electrons collide with Si lattice atoms, and electron-hole pairs are generated due to the kinetic energy. Some of the generated electrons flow into the first gate conductor layer 5a and the second gate conductor layer 5b, but most of them flow into the N$^+$ layer 3b connecting to the bit line BL. To write "1," it is also possible to generate electron-hole pairs using a gate induced drain leakage (GIDL) current, and then fill the floating body FB with the generated holes (see Non Patent Literature 14). It should be noted that it is also possible to generate electron-hole pairs through an impact ionization phenomenon at the boundary between the N$^+$ layer 3a and the channel region 7 or the boundary between the N$^+$ layer 3b and the channel region 7.

Figure 3B:
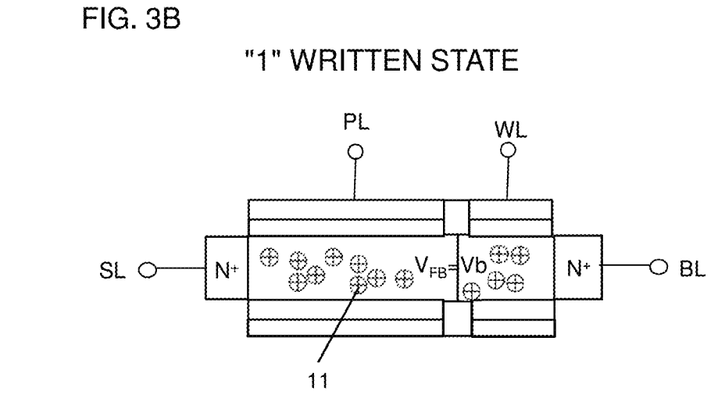

As illustrated in FIG. 3B, the generated holes 11 are the majority carriers in the channel region 7, and charge the channel region 7 in a positively biased manner. In such a case, more holes are stored in the first channel region 7a than in the second channel region 7b. Since the N$^+$ layer 3a connecting to the source line SL is at 0 V, the channel region 7 is charged up to the built-in voltage Vb (about 0.7 V) of the P-N junction between the N$^+$ layer 3a connecting to the source line SL and the channel region 7. When the channel region 7 is charged in a positively biased manner, the threshold voltage of each of the first N-channel MOS transistor region and the second N-channel MOS transistor region becomes low due to the substrate bias effect.

Figure 3C:
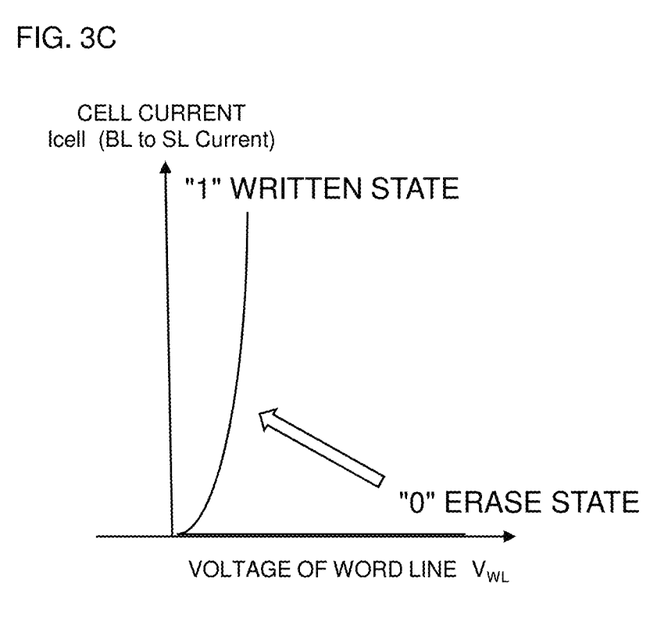
Figure 4:
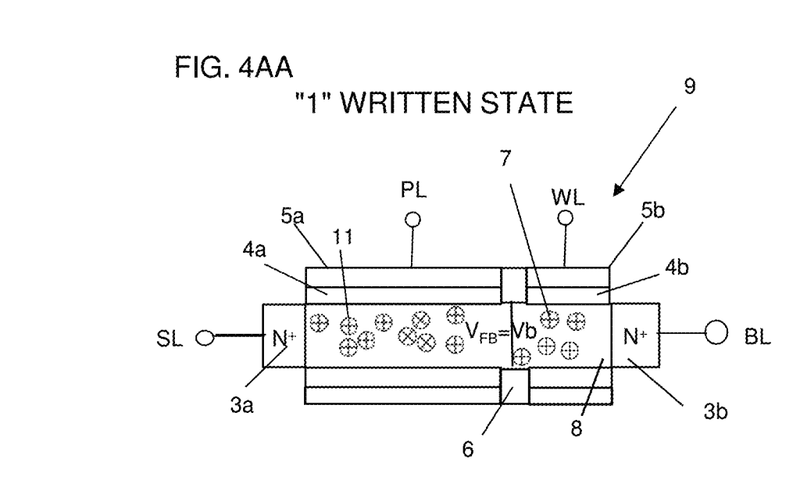

Accordingly, as illustrated in FIG. 3C, the threshold voltage of the second N-channel MOS transistor region in the second channel region 7b connecting to the word line WL becomes low. Such a written state of the channel region 7 is allocated as logical memory data "1."

It should be noted that during the write operation, it is also possible to generate electron-hole pairs through an impact ionization phenomenon or using a GIDL current not in the aforementioned first boundary region but in a second boundary region between the N$^+$ layer 3a and the first channel region 7a or a third boundary region between the N$^+$ layer 3b and the second channel region 7b, and then charge the channel region 7 with the generated holes 11. It should be also noted that the aforementioned conditions of the voltages applied to the bit line BL, the source line SL, the word line WL, and the plate line PL are only examples for performing a write operation. Thus, other operating conditions may also be employed as long as a write operation can be performed.

A read operation for the dynamic flash memory cell according to the first embodiment of the present invention will be described with reference to FIGS. 4AA-4AC and 4BA-4BD. A read operation for the dynamic flash memory cell will be described with reference to FIGS. 4AA-4AC. As illustrated in FIG. 4AA, when the channel region 7 is charged up to the built-in voltage Vb (about 0.7 V), the threshold voltage of the N-channel MOS transistor drops due to the substrate bias effect. Such a state is allocated as the logical memory data "1." As illustrated in FIG. 4AB, in a memory block selected before a write operation is performed, the floating voltage $V_{FB}$ of the channel region 7, which has been set to the erase state "0" in advance, is $V_{ERA}$+Vb. Through a write operation, the written state "1" is randomly stored. Consequently, logical memory data at logic levels "0" and "1" are created for the word line WL. As illustrated in FIG. 4AC, reading is performed with a sense amplifier by utilizing the difference in level between the two threshold voltages for the word line WL. It should be noted that in reading data, setting the voltage applied to the first gate conductor layer 5a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high for reading the logical memory data "0" as illustrated in FIG. 4AC.

The magnitude relationship between the gate capacitances of the first gate conductor layer 5a and the second gate conductor layer 5b during a read operation for the dynamic flash memory cell according to the first embodiment of the present invention, and an operation related thereto will be described with reference to FIGS. 4BA-4BD. It is desirable that the gate capacitance of the second gate conductor layer 5b connecting to the word line WL be designed to be smaller than the gate capacitance of the first gate conductor layer 5a connecting to the plate line PL. As illustrated in FIG. 4BA, the length in the vertical direction of the first gate conductor layer 5a connecting to the plate line PL is set longer than the length in the vertical direction of the second gate conductor layer 5b connecting to the word line WL so that the gate capacitance of the second gate conductor layer 5b connecting to the word line WL becomes smaller than the gate capacitance of the first gate conductor layer 5a connecting to the plate line PL. FIG. 4BB illustrates an equivalent circuit of a single cell of the dynamic flash memory in FIG. 4BA. In addition, FIG. 4BC illustrates the relationship among the coupled capacitances of the dynamic flash memory. Herein, $C_{WL}$ represents the capacitance of the second gate conductor layer 5b, $C_{PL}$ represents the capacitance of the first gate conductor layer 5a, $C_{BL}$ represents the capacitance of the P-N junction between the N$^+$ layer 3b serving as the drain and the second channel region 7b, and $C_{SL}$ represents the capacitance of the P-N junction between the N$^+$ layer 3a serving as the source and the first channel region 7a. As illustrated in FIG. 4BD, when the voltage of the word line WL oscillates, the operation has influence as noise on the channel region 7. Potential fluctuation $\Delta V_{FB}$ of the channel region 7 at this time is represented as follows.

$$\Delta V_{FB} = C_{WL}/(C_{PL}+C_{WL}+C_{BL}+C_{SL}) \times V_{ReadWL} \quad (4)$$

Herein, $V_{ReadWL}$ is the oscillating potential of the word line WL during reading. As is obvious from Expression (4), $\Delta V_{FB}$ can be made small by setting the contribution rate of $C_{WL}$ low in comparison with the entire capacitance $C_{PL}+C_{WL}+C_{BL}+C_{SL}$ of the channel region 7. It is also possible to further reduce $\Delta V_{FB}$ by setting the length in the vertical direction of the first gate conductor layer 5a connecting to the plate line PL to be further longer than the length in the vertical direction of the first second conductor layer 5b connecting to the word line WL, without decreasing the degree of integration of the memory cell as seen in plan view. It should be noted that the aforementioned conditions of the voltages applied to the bit line BL, the source line SL, the word line WL, and the plate line PL are only examples for performing a read operation. Thus, other operating conditions may also be employed as long as a read operation can be performed.

It should be noted that it is acceptable as long as the present dynamic flash memory device described in the present embodiment has a structure that satisfies the condition that the holes 11 generated through an impact ionization phenomenon or using a gate induced drain leakage current are retained in the channel region 7. To this end, it is acceptable as long as the channel region 7 has a floating body structure isolated from the substrate 1. Accordingly, even when the semiconductor base material of the channel region is formed horizontally on the substrate 1 using the GAA (Gate All Around; for example, see Non Patent Literature 11) technology, which is one of SGTs, or the nanosheet technology (for example, see Non Patent Literature 12), for example, the aforementioned dynamic flash memory operation can be performed. Alternatively, a device structure using SOI (Silicon On Insulator; for example, see Non Patent Literatures 7 to 10) may also be used. In such a device structure, the bottom of the channel region is in contact with an insulating layer of a SOI substrate, and the channel region is surrounded by a gate insulating layer and element isolation insulating layers together with other channel regions. Even in such a structure, the channel region has a floating body structure. In this manner, it is acceptable as long as the dynamic flash memory device provided by the present embodiment satisfies the condition that its channel region has a floating body structure. Further, even with a structure in which a Fin transistor (for example, see Non Patent Literature 13) is formed on a SOI substrate, the present dynamic flash memory operation can be performed as long as its channel region has a floating body structure.

It should be noted that in FIG. 1, the length in the vertical direction of the first gate conductor layer 5a connecting to the plate line PL is set further longer than the length in the vertical direction of the second gate conductor layer 5b connecting to the word line WL so that $C_{PL}>C_{WL}$. However, it is possible to reduce the capacitive coupling ratio ($C_{WL}/(C_{PL}+C_{WL}+C_{BL}+C_{SL})$) of the word line WL to the channel region 7 only by adding the plate line PL. Consequently, potential fluctuation $\Delta V_{FB}$ of the channel region 7 as the floating body becomes small.

In addition, a fixed voltage of 2 V, for example, may be applied as the voltage $V_{ErasePL}$ of the plate line PL regardless of each operation mode. In addition, 0 V, for example, may be applied as the voltage $V_{ErasePL}$ of the plate line PL only during erasing. Further, a fixed voltage or a voltage that changes with time may be applied as the voltage $V_{ErasePL}$ of the plate line PL as long as such a voltage satisfies the condition that the dynamic flash memory operation can be performed.

Although the first Si pillar 2a and the second Si pillar 2b illustrated in FIG. 1 have rectangular vertical cross-sections, the first Si pillar 2a and the second Si pillar 2b may also have trapezoidal vertical cross-sections. In addition, the Si pillar 2a and the Si pillar 2b may have different vertical cross-sectional shapes, such as a rectangular shape and a trapezoidal shape. Further, the first Si pillar 2a and the second Si pillar 2b may be formed of layers of different semiconductor materials.

The dynamic flash memory operation can be performed even when the first gate conductor layer 5a in FIG. 1 partially surrounds the first gate insulating layer 4a. In addition, the dynamic flash memory operation can be performed even when the first gate conductor layer 5a is split into a plurality of conductor layers and the resulting conductor layers are driven synchronously or asynchronously. Similarly, the dynamic flash memory operation can be performed even when the second gate conductor layer 5b is split into a plurality of conductor layers and the resulting conductor layers are operated synchronously or asynchronously.

In FIG. 1, the N$^+$ layer 3a also serves as a wire conductor layer of the source line SL. As the source line SL, it is also possible to connect a conductor layer, such as a W layer, for example, to the N$^+$ layer 3a at the bottom of the Si pillar 2a. Further, it is also possible to form a conductor layer of metal, such as a W layer, or alloy, for example, on the N$^+$ layer 3a on the outer side of the region where many Si pillars 2a are formed two-dimensionally.

The dynamic flash memory operation can also be performed with a structure obtained by reversing the polarity of the conductivity of each of the N$^+$ layers 3a and 3b, the first channel region 7a as the P$^+$ layer, and the second channel region 7b as the P layer. In such a case, the majority carriers in the N-type first Si pillar 2a and the N-type second Si pillar 2b are electrons. Thus, electrons generated through impact ionization are stored in the channel region 7, and the channel region 7 is thus set to the state "1."

In FIG. 1, the first gate conductor layer 5a connecting to the plate line PL is provided adjacent to the N⁺ layer 3a connecting to the source line SL, and the second gate conductor layer 5b connecting to the word line WL is provided adjacent to the N⁺ layer 3b connecting to the bit line BL, but it is also possible to connect the first gate conductor layer 5a to the word line WL and connect the second gate conductor layer 5b to the plate line PL. In such a case, the concentration of acceptor impurities in the second channel region 7b is set higher than the concentration of acceptor impurities in the first channel region 7a.

The present embodiment has the following features.
(Feature 1)
In the dynamic flash memory cell according to the first embodiment of the present invention, the voltage of the word line WL oscillates up and down while a write operation or a read operation is performed on the dynamic flash memory cell. At this time, the plate line PL performs the role of reducing the capacitive coupling ratio between the word line WL and the channel region 7. Consequently, it is possible to significantly suppress the influence of changes in the voltage of the channel region 7 when the voltage of the word line WL oscillates up and down. Accordingly, it is possible to increase the difference between the threshold voltages corresponding to logic levels of "0" and "1." This leads to an increased operation margin of the dynamic flash memory cell.
(Feature 2)
As the first Si pillar 2a is formed as a P⁺ layer, the number of holes 11 stored therein per unit volume can be made larger than that in the second Si pillar 2b as a P layer. Accordingly, during a write operation, the holes 11 generated through an impact ionization phenomenon are mainly stored in the first channel region 7a as the P⁺ layer. Accordingly, the MOS transistor portion connecting to the plate line PL mainly functions as a signal charge storage portion, while the MOS transistor portion connecting to the word line WL mainly functions as a switching portion. In addition, as the holes 11 are mainly stored in the first channel region 7a located away from the second channel region 7b that is directly influenced by a pulse voltage applied to the word line WL, a stable operation of the dynamic flash memory can be achieved.

Second Embodiment

Figure 5:
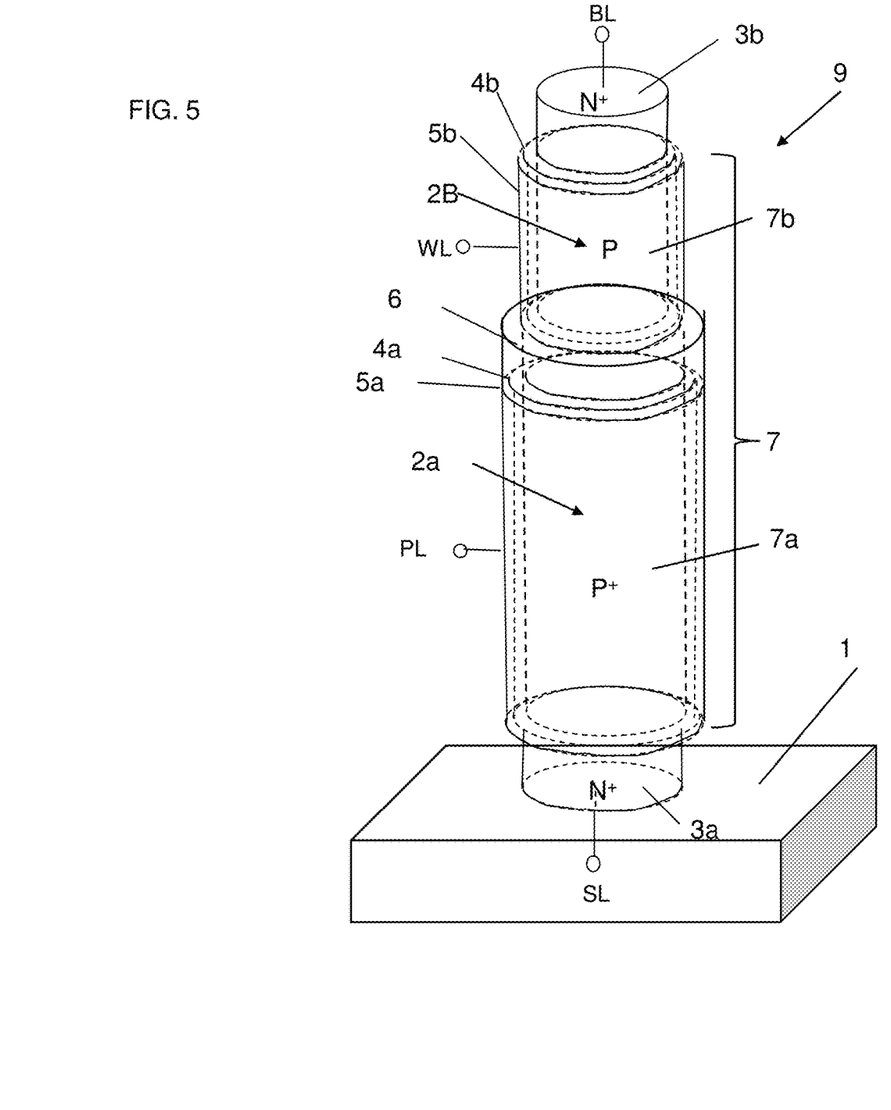
FIG. 5 is a view of the structure of a memory device including SGTs according to a second embodiment.

The structure of dynamic flash memory of a second embodiment will be described with reference to FIG. 5. It should be noted that in the actual memory device, a large number of dynamic flash memory cells 9 are arranged in a matrix on a substrate 1. In FIG. 5, portions identical to or similar to those in FIG. 1 are denoted by identical reference signs.

A second Si pillar 2B as a P layer is provided continuously with and above the first Si pillar 2a as the P⁺ layer. The outer circumferential line of the first Si pillar 2a is located on the outer side of the outer circumferential line of the second Si pillar 2B. The other portions are the same as those in FIG. 1.

The present embodiment has the following feature. In the present embodiment, when the data "1" is written, holes are stored in the first channel region 7a of the first Si pillar 2a. In such a case, the first Si pillar 2a as the P⁺ layer functions as a hole storage portion, while the second Si pillar 2b as the P layer mainly functions as a switching channel for reading "1" or "0." For example, in a structure in which the first gate conductor layer 5a on the outer periphery of the first Si pillar 2a connects to an adjacent gate electrode, an adjacent Si pillar can be provided at a position as close as possible to the first Si pillar 2a. In such a case, however, if the second Si pillar 2b has the same cross-sectional shape as the first Si pillar 2a as illustrated in FIG. 1, it would be impossible to form, in the adjacent cells, the second gate conductor layers 5b connecting to the word line WL that are away from each other in one direction and connect together in a direction orthogonal to such a direction. In contrast, if the second Si pillar 2B is formed such that its outer circumferential line is located on the inner side of the outer circumferential line of the first Si pillar 2a as illustrated in FIG. 5, it is possible to easily form the second gate conductor layers 5b connecting to the word line that connect together in a first direction and are away from each other in a direction orthogonal to the first direction. Accordingly, the degree of integration of the dynamic flash memory can be increased.

Other Embodiments

Each of the N⁺ layers 3a and 3b in the first embodiment may also be formed of a layer of other semiconductor materials containing donor impurities. In addition, the first Si pillar 2a and the second Si pillar 2b may be formed of layers of different semiconductor materials each containing acceptor impurities. This is also true of the other embodiments according to the present invention.

In the first embodiment, as the gate conductor layer 5a connecting to the plate line PL, it is possible to use a single conductor material layer or multiple conductor material layers combined together. Likewise, as the gate conductor layer 5b connecting to the word line WL, it is possible to use a single conductor material layer or multiple conductor material layers combined together. In addition, the outer side of each gate conductor layer may connect to a wire metal layer of W, for example. This is also true of the other embodiments according to the present invention.

In the first embodiment, the shape of each of the first Si pillar 2a and the second Si pillar 2b as seen from its central axis direction is circular. However, it may be elliptical, or a shape elongated in one direction, for example. It is also possible to form Si pillars with different shapes as seen in plan view in a mixed manner in a logic circuit region, which is formed away from the region of the dynamic flash memory cells, in accordance with the logic circuit design. This is also true of the other embodiments according to the present invention.

In FIG. 1, in a portion of the channel region 7 surrounded by the insulating layer 6 in the vertical direction, potential distributions of the first channel region 7a and the second channel region 7b are formed continuously. Accordingly, the channel region 7 including the first channel region 7a and the second channel region 7b is continuous in the vertical direction across its region surrounded by the insulating layer 6. This is also true of the other embodiments according to the present invention.

In the description of the first embodiment, the source line SL is negative-biased during an erase operation so that holes in the channel region 7 functioning as the floating body FB are pulled out. However, it is also possible to perform an erase operation by negative-biasing the bit line BL instead of the source line SL, or negative-biasing the source line SL and the bit line BL. Alternatively, an erase operation may be performed under other voltage conditions. This is also true of the other embodiments according to the present invention.

In addition, in FIG. 1, an N-type or P-type impurity layer may be provided between the N⁺ layer 3a and the first Si pillar 2a as the P⁺ layer. In addition, an N-type or P-type impurity layer may be provided between the N⁺ layer 3b and the second Si pillar 2b as the P layer. This is also true of the other embodiments according to the present invention.

Further, in FIG. 1, one or both of the first gate conductor layer 5a and the second gate conductor layer 5b may be split into a plurality of conductor layers. This is also true of the other embodiments according to the present invention.

The present invention can be implemented in various embodiments and modifications without departing from the broad spirit and scope of the present invention. In addition, each of the aforementioned embodiments only describes an example of the present invention and is not intended to limit the scope of the present invention. The aforementioned examples and modified examples can be combined as appropriate. Further, even if some of the components of the aforementioned embodiments are removed as needed, the resulting structure is within the technical idea of the present invention.

INDUSTRIAL APPLICABILITY

With the memory device using the semiconductor elements according to the present invention, it is possible to obtain high-density and high-performance dynamic flash memory.

The invention claimed is:

1. A memory device using semiconductor elements, comprising:
    a first semiconductor base material provided on a substrate in a manner standing in an upright position along a vertical direction or extending in a horizontal direction with respect to the substrate;
    a second semiconductor base material continuous with the first semiconductor base material, the second semiconductor base material having the same conductivity as the first semiconductor base material and having a lower concentration of impurities than a concentration of impurities in the first semiconductor base material;
    a first gate insulating layer partially or entirely surrounding a side face of the first semiconductor base material on one end side;
    a second gate insulating layer continuous with the first gate insulating layer, and partially or entirely surrounding a side face of the second semiconductor base material on another end side;
    a first gate conductor layer covering the first gate insulating layer;
    a second gate conductor layer covering the second gate insulating layer;
    a first impurity layer provided on an outer side of one end of the first gate conductor layer along a direction of extension of the first semiconductor base material, the first impurity layer having a polarity opposite to a polarity of the first semiconductor base material; and
    a second impurity layer provided on an outer side of one end of the second gate conductor layer, the second impurity layer having a polarity opposite to a polarity of the second semiconductor base material,
    wherein:
    each of a memory write operation, a memory read operation, and a memory erase operation is performed by controlling a voltage applied to the first impurity layer, the second impurity layer, the first gate conductor layer, and the second gate conductor layer.

2. The memory device using the semiconductor elements according to claim 1, wherein the concentration of impurities in the first semiconductor base material is lower than the concentration of impurities in the first impurity layer.

3. The memory device using the semiconductor elements according to claim 1, wherein an outer circumferential line of the first semiconductor base material as seen from a central axis direction is located on an outer side of an outer circumferential line of the second semiconductor base material.

4. The memory device using the semiconductor elements according to claim 1, wherein a first gate capacitance between the first gate conductor layer and the first semiconductor base material is larger than a second gate capacitance between the second gate conductor layer and the second semiconductor base material.

5. The memory device using the semiconductor elements according to claim 1, wherein:
    the memory write operation is performed by performing an operation of generating electrons and holes in one or both of the first semiconductor base material and the second semiconductor base material through an impact ionization phenomenon based on a current flowed between the first impurity layer and the second impurity layer or using a gate induced drain leakage current, an operation of removing, from among the generated electrons and holes, the electrons or the holes that are minority carriers in the first semiconductor base material and the second semiconductor base material, and an operation of causing the electrons or the holes that are majority carriers in the first semiconductor base material and the second semiconductor base material to partially or entirely remain in at least the first semiconductor base material, and
    the memory erase operation is performed by controlling a voltage applied to each of the first impurity layer, the second impurity layer, the first gate conductor layer, and the second gate conductor layer to remove from the first semiconductor base material and the second semiconductor base material the electrons or the holes that are the majority carriers remaining in the first semiconductor base material and the second semiconductor base material.

* * * * *